United States Patent [19]

Iizuka et al.

[11] Patent Number: 4,985,512
[45] Date of Patent: Jan. 15, 1991

[54] HIGH-LUBRICITY FILM

[75] Inventors: Yo Iizuka; Ken Kashiwadate; Toshio Hosokawa; Shunzo Endo; Takayuki Katto, all of Iwaki; Toshiya Mizuno, Tsuchiura; Kenichi Katase, Ushiku, all of Japan

[73] Assignee: Kureha Kagaku Kogyo K. K., Japan

[21] Appl. No.: 262,304

[22] Filed: Oct. 25, 1988

[30] Foreign Application Priority Data

Nov. 5, 1987 [JP] Japan ................................ 62-278277

[51] Int. Cl.$^5$ ........................... C08L 81/06; B29B 7/26
[52] U.S. Cl. .................................. 525/537; 264/290.2; 525/189
[58] Field of Search ...................... 525/189, 537, 391

[56] References Cited

U.S. PATENT DOCUMENTS

| | | |
|---|---|---|
| 3,354,129 | 11/1967 | Edmonds, Jr. et al. . |
| 3,919,177 | 11/1975 | Campbell . |
| 4,476,284 | 10/1984 | Cleary ................................ 525/537 |
| 4,645,826 | 2/1987 | Iizuka et al. . |
| 4,731,390 | 3/1988 | Mizuno et al. . |
| 4,769,426 | 9/1988 | Iwasaki et al. . |
| 4,894,419 | 1/1990 | Mizuno et al. ...................... 525/189 |

FOREIGN PATENT DOCUMENTS

| | | |
|---|---|---|
| 13469 | 5/1978 | Japan . |
| 59-5101 | 2/1984 | Japan . |
| 14228 | 1/1986 | Japan . |

OTHER PUBLICATIONS

Hallensleben, European Polymer Journal, vol. 13, pp. 437–440.

Primary Examiner—John C. Bleutge
Assistant Examiner—David W. Woodward
Attorney, Agent, or Firm—Lowe, Price, Leblanc, Becker & Shur

[57] ABSTRACT

A film having high lubricity and excellent dielectric strength characteristics and containing few fish eyes is obtained by biaxially-stretching a resin composition which has been obtained by radical polymerization of 0.5–80 parts by weight of a monomer component composed principally of a styrene monomer in the presence of 100 parts by weight of particles of a substantially straight-chain poly(arylene sulfide) having a melt viscosity of at least 1,000 poises.

8 Claims, 2 Drawing Sheets

HIGH-LUBRICITY FILM

FIELD OF THE INVENTION

This invention relates to a high-lubricity film made of a poly(arylene sulfide)-based resin composition, and more specifically to a film having high lubricity and excellent dielectric strength characteristics, containing few fish eyes and obtained by biaxially stretching a resin composition which has been obtained by radical polymerization of a monomer component composed principally of a styrene monomer in the presence of particles of a substantially linear poly(arylene sulfide) having a melt viscosity of at least 1,000 poises. The film is useful, especially, as a capacitor film.

BACKGROUND OF THE INVENTION

It has been known to form poly(arylene sulfides) represented by poly(p-phenylene sulfide) into biaxially-stretched films. These poly(arylene sulfides) and poly(p-phenylene sulfide) may hereinafter be called "PAS" and "PPS" respectively. Incidentally, in order to make a film useful as an industrial film, it is necessary to reduce the coefficient of dynamic friction while controlling the surface roughness within a predetermined range and hence retaining planarity, in other words, to impart high lubricity. The friction coefficient, namely, slip properties between plastic films themselves or between a plastic film and another material generally give significant influence to the efficiency of work when the plastic films or film is processed. When coating, printing or wrapping is performed using a film having poor slip properties, a large tensile force is applied to the film so that difficulties are encountered in feeding the film or taking it up into a roll. When the film is employed as a capacitor film in particular, the film is processed through many take-up and rewinding steps in the course of its assembly into a capacitor element. If the slip properties of the film are poor, the film may be torn, stretched and whitened, and/or caused to develop wrinkles. Due to these problems, the film cannot be assembled successfully into a capacitor element or even if it looks as if assembled into a capacitor element, the capacitor element involves one or more fatal defects and cannot be used practically as a capacitor element. On the other hand, unduly good slip properties may also deteriorate the efficiency of work in some instances, including the occurrence of irregular winding by way of example. It is therefore necessary to improve slip properties of a film, in other words, to render the film slidable easily to a certain extent. These easily slidable properties will hereinafter be called "high lubricity" for the sake of brevity. For PPS films, it is also essential to impart high lubricity from the practical viewpoint. It has heretofore been known to control the surface roughness of a film by adding, as a filler, one or more inert inorganic materials in the form of fine powder, for example, calcium carbonate, silica, alumina, carbon black, glass, calcium phosphate and/or the like (Japanese Patent Publication No. 5101/1984). The addition of such an inorganic filler however results in a reduction in the dielectric strength of a PPS film, thereby making the film somewhat insufficient for use as a capacitor base material or electrically-insulating base material in view of the standard of properties required presently for such an application.

The present inventors have already proposed to add poly-4-methylpentene-1 in place of a conventional inorganic filler with a view toward imparting high lublicity to PAS (Japanese Patent Application No. 75827/1986; Japanese Laid-Open Publication No. 232442/1987; U.S. Pat. No. 4731390; Canadian Patent Application No. 533626; European Patent Application No. 87302846 8). The resultant composition has however been found not to be fully satisfactory in process-ability such as extrusion stability.

On the other hand, polystyrene films have excellent electrical properties and are used as insulating films, especially, as capacitor films. They however have a drawback that their heat resistance is inferior.

It has also been known to blend a polystyrene-based resin with PAS in order to modify the latter resin, as disclosed in Japanese Patent Publication No. 13469/1978 by way of example. However, the PAS employed in the above patent publication is such that could be obtained in accordance with a process disclosed, for example, in Japanese Patent Publication No. 3368/1970, namely, by reacting a polyhalogenated aromatic compound and an alkali metal sulfide at an elevated temperature in a polar organic medium. PAS obtained by such a process has an extremely low polymerization degree and a low melt viscosity, so that it cannot be formed into biaxially-stretched films, to say nothing of its extrusion into films. In addition, the PPS of the low polymerization degree still cannot provide useful films even when it is crosslinked or cured in order to permit its injection. The resin composition described in Japanese Patent Publication No 13469/1978 has been provided with a view toward improving the moldability and impact resistance of PAS without lowering its tensile property The resin composition is said to be moldable into articles for various application fields. Its formation into films is however not disclosed there.

It has also been known to blend one or more of various synthetic resins with PAS having a high molecular weight in general. It has however been unknown to form a resin composition, which is composed of PAS and a polystyrene-based resin, into a biaxially-stretched film.

As has been described above, it has not been possible to avoid the reduction of dielectric strength characteristics so long as high lubricity is imparted to a PAS film by the addition of an inorganic filler. Furthermore, it has not been known to form a resin composition, which is composed of PAS and a polystyrene-based resin, into a biaxially-stretched film.

In the meantime, the present inventors found that a resin composition formed by blending a polystyrene-based resin with a substantially linear, high molecular weight PAS surprisingly has good film-forming properties, permits biaxial stretching, has high lubricity without need for addition of an inorganic filler and can provide a biaxially-stretched film having superb dielectric strength characteristics. An application has already been filed on that subject matter, to which Japanese Patent Application No. 116777/1987 (U.S. Patent Application Ser. No. 191131 filed May 6, 1988; European Patent Application No. 88304309.3) has been allotted. Although the biaxially-stretched film has high lubricity and is excellent in dielectric strength characteristics, its surfaces tend to become somewhat too rough. In addition, PAS films generally contain many so-called fish eyes. This tendency cannot however be improved to any significant extent even by the blending of the styrene-based resin.

SUMMARY OF THE INVENTION

An object of this invention is therefore to solve the above-described problems and to provide a poly(arylene sulfide) film which has a small surface roughness, excellent planarity, a small coefficient of dynamic friction and high lubricity.

Another object of this invention is to obtain a poly(arylene sulfide) film which is free of fish eyes and has good surface characteristics.

The present inventors have thus carried out an extensive investigation. As a result, it has been found that a resin composition obtained by radical polymerization of a monomer component composed principally of a styrene monomer in the presence of particles of a substantially straight-chain poly(arylene sulfide) has good film-forming properties, permits biaxial stretching, has high lubricity without need for addition of an inorganic filler and can provide a biaxially-stretched film having superb dielectric strength characteristics, improved considerably in surface roughness over films obtained by physically blending a styrene-based resin and reduced in the formation of fish eyes. The present invention has been completed on the basis of the above finding.

In one aspect of this invention, there is thus provided a high-lubricity film obtained by biaxially stretching a resin composition which has been obtained by radical polymerization of 0.5–80 parts by weight of a monomer component composed principally of a styrene monomer in the presence of 100 parts by weight of particles of a substantially straight-chain poly(arylene sulfide) (PAS particles) having a melt viscosity of at least 1,000 poises.

BRIEF DESCRIPTION OF THE DRAWINGS

FIGS. 1 through 4 diagrammatically show three-dimensional roughness of high-lubricity films according to this invention and a film of a Comparative Example respectively, in which:

FIG. 1 depicts the surface conditions of a film obtained in Example 1;

FIG. 2 illustrates the surface conditions of a 15%-styrene film in Table 3 to be described subsequently;

FIG. 3 shows the surface conditions of a 20%-styrene film in Table 3 to be described subsequently; and FIG. 4 shows the surface conditions of a film obtained by blending a styrene-based resin in Comparative Example 3.

Figure 1:
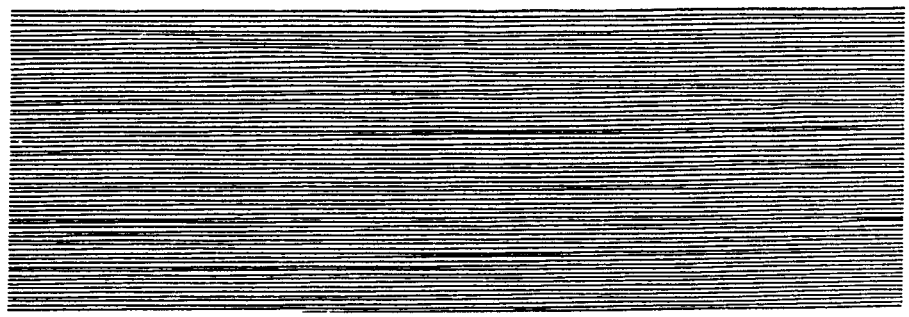

In each of the drawings, the horizontal and vertical directions indicate the machine direction (magnified 200×) and transverse direction (magnified 200×) of the corresponding film respectively, while the direction perpendicular to the plane of the drawing sheet shows the height/depth direction of ruggedness in the surface of the film (magnified 10,000×). These three-dimensional roughness diagrams were obtained by scanning the respective films in their machine directions by means of a three-dimensional surface roughness meter.

DETAILED DESCRIPTION OF THE INVENTION

When a monomer component composed principally of a styrene monomer is subjected to radical polymerization in the presence of PAS particles, most of the monomer component is adsorbed and/or absorbed within the PAS particles and is polymerized there because the PAS particles have a porous structure defining a number of minute openings (fine pores). The resultant resin composition has such a structure that the radically-polymerized polymer is minutely dispersed within the PAS particles, thereby forming a polymer alloy which is extremely uniform compared with ordinary blends formed by a physical method such as molten blends. A film obtained by biaxially stretching the resin composition is improved further in the dispersion of the styrene-based resin, so that its surfaces are smooth and free of fish eyes and exhibit very high lubricity.

Elements of the present invention will herein-after be described in detail.

Poly(arylene sulfide)

PAS particles generally have a porous structure defining certain minute openings (fine pores) therein even when they are in the form of fine powder. Those having high specific surface area and high porosity are however desired in order to have the monomer component, which is composed principally of a styrene monomer, radically polymerized within the PAS particles as much as possible. PAS particles of such a porous structure may be obtained by a known method as described, for example, in Japanese Patent Laid-Open No. 7332/1986 or 14228/1986 or Japanese Patent Publication No. 12240/1977.

The PAS particles employed in the present invention are required to be particles of a substantially linear, high molecular weight resin having a melt viscosity of at least 1,000 poises (as measured at 310° C and a shear rate of 200 sec$^{-1}$), preferably, 2,500–100,000 poises in order to form them into a biaxially-stretched film. The term "substantially linear" high molecular weight PAS as used herein does not mean a polymer obtained as a result of viscosity increment (curing) through oxidative crosslinking but does mean a polymer obtained from a monomer component composed principally of a practically bifunctional monomer.

If the melt viscosity of a PAS is smaller than 1,000 poises, its polymer alloy with a styrene-based resin even when formed will be poor in film-forming properties and will be unable to provide a biaxially-stretched film stably.

Such a substantially linear, high molecular weight PAS can be produced by a desired known process. For example, it may be obtained suitably by subjecting an alkali metal sulfide and a dihalogenated aromatic compound to specific two-stage heat-up polymerization in the presence of water in an organic amide solvent such as N-methylpyrrolidone, as described in Japanese Patent Laid-Open No. 7332/1986.

Illustrative examples of the alkali metal sulfide may include lithium sulfide, sodium sulfide, potassium sulfide, rubidium sulfide, cesium sulfide and mixtures thereof.

As exemplary dihalogenated aromatic compounds, may be mentioned p-dichlorobenzene, m-dichlorobenzene, 2,5-dichlorotoluene, p-dibromobenzene, 2,6-dichloronaphthalene, 1-methoxy-2,5-dichlorobenzene, 4,4'-dichlorobiphenyl, 3,5-dichlorobenzoic acid, p,p'-dichlorodiphenyl ether, 4,4'-dichlorodiphenyl sulfone, 4,4'-dichlorodiphenyl sulfoxide and 4,4'-dichlorodiphenyl ketone. They may be used either singly or in combination.

The PAS employed in this invention is substantially linear, with a poly(phenylene sulfide) (PPS), especially a poly(p-phenylene sulfide) or a copolymer containing p-phenylene sulfide units and m-phenylene sulfide units as minor components being preferred. As such PPS and their copolymers, commercial products may be used.

The term "poly(arylene sulfide) (PAS)" will hereinafter mean a substantially linear, high molecular PAS at every occurrence unless otherwise specifically indicated.

No particular limitation is imposed on the size or shape of PAS particles to be used in the present invention, so that those ranging from a fine powdery form to a granular form are usable. Those having a granular form are however desirable in view of their ease in polymerization and post-polymerization handling. In particular, those having an average particle size of 100 $\mu$m or greater are used suitably, with granular particles of about 200–2,000 $\mu$m being preferable. In order to have the monomer component composed principally of the styrene monomer undergo radical polymerization within the pores of PAS particles, it is desirable for the PAS particles to have high specific surface area and porosity. Using the BET specific surface area as determined by the adsorption of nitrogen as an index for indicating the degree of porosity of PAS particles, the specific surface area of the PAS particles in this invention may be preferably at least 3 $m^2/g$, more preferably at least 5 $m^2/g$, most preferably at least 10 $m^2/g$. If this specific surface area is extremely small, it would be more likely that the monomer component composed principally of the styrene monomer would be polymerized outside the pores of the PAS particles, thereby making it difficult to achieve desired uniform dispersion as a polymer alloy.

Incidentally, PAS particles obtained by the known production process described above are weakly alkaline in general. Although these PAS particles may be used as they are, their advance treatment with an aqueous solution of an acid or a strong acid-weak base salt can avoid discoloration (coloration) in subsequent steps. Hydrochloric acid, sulfuric acid or the like may be mentioned as the acid, while ammonium chloride, ammonium sulfate or the like may be mentioned as the strong acid-weak base salt (Japanese Patent Laid-Open No. 48728/1987).

Although the PAS particles may be used in an undried wet state subsequent to their processing through various steps such as polymerization and washing, it is preferable to use them in a dry state so as to facilitate penetration of the styrene monomer or the like into the pores of the PAS particles under conditions for radical polymerization.

Monomer Component Composed Principally of Styrene Monomer

Illustrative examples of the styrene monomer useful in the practice of this invention may include styrene, styrene derivatives such as $\alpha$-methylstyrene, vinyltoluene and chlorostyrene and mixtures thereof. Of these, styrene is especially suitable.

The monomer component employed in this invention and composed principally of the styrene monomer may be a styrene monomer alone. As an alternative, one or more monomers other than the styrene monomer may also be copolymerized suitably.

As monomers other than styrene monomers, there are various monomers polymerizable with a styrene monomer under conditions for radical polymerization. Described specifically, nitrile monomers such as acrylonitrile and methacrylonitrile; conjugated diene monomers such as butadiene, isoprene and chloroprene; carboxyl-containing monomers such as acrylic acid and methacrylic acid; acrylic ester monomers such as methyl acrylate, ethyl acrylate, n-propyl acrylate, isopropyl acrylate, n-butyl acrylate, 2-ethylhexyl acrylate and n-octyl acrylate; methacrylic ester monomers such as methyl methacrylate, ethyl methacrylate and n-butyl methacrylate; amino-containing monomers such as acrylamide and methacrylamide; halogen-containing monomers such as vinyl chloride, vinylidene chloride, vinyl fluoride, vinylidene fluoride, trifluoromonochloroethylene and tetrafluoroethylene; epoxy-containing monomers such as glycidyl methacrylate; carboxyl-containing monomers such as monomethyl itaconate, monoethyl itaconate and monobutyl itaconate; and mixtures thereof may be mentioned by way of example.

One or more of these comonomers may be used together with one or more styrene monomers as principal component or components. Although their proportions may be determined suitably depending on the kind of each comonomer, the monomer or monomers other than the styrene monomer or monomers may generally be used in a total amount of 30 wt. % or less, preferably, 20 wt. % or less. If the proportion of the comonomer or comonomers becomes extremely high, the resulting resin composition will be deteriorated in film-forming properties and dielectric strength. Such an extremely high proportion is therefore not preferred.

The use of one or more comonomers imparts various properties to a film as compared to the single use of a styrene monomer. For example, the use of a small amount of acrylamide, methacrylamide or monomethyl itaconate along with styrene makes it possible to impart eliminating properties of static electricity to films to be obtained.

The monomer component composed principally of the styrene monomer is used in a proportion such as giving 0.5–80 parts by weight, preferably 2–50 parts by weight, most preferably 3–25 parts by weight, all, per 100 parts by weight of the PAS particles. If the proportion of the monomer is extremely small, its effects to impart high lubricity to a film cannot be exhibited fully. In contrast, the use of the styrene monomer in an extremely large proportion can improve the processability, but lowers the inherent high heat resistance of the PAS and cannot improve the lubricity and dielectric strength characteristics any further. It is hence not preferred to use the styrene monomer in such an extremely large proportion. From the standpoint of lubricity in particular, any excess use of the monomer component results in the formation of more polymer from the monomer component not adsorbed or absorbed in PAS particles so that the dispersion of the styrene-based resin is reduced. It is hence not preferable to use the monomer component in any unduly high proportion.

Polymerization Process

The composition useful in the practice of this invention can be obtained by subjecting a monomer component, which is composed principally of a styrene monomer, to radical polymerization in the presence of PAS particles.

The polymerization may be effected by any conventional radical polymerization process which makes use of a radical polymerization initiator, and no particular limitation is imposed thereon An oil-soluble radical polymerization initiator soluble in the monomer component, such as $\alpha,\alpha'$-azobisisobutyronitrile or t-butyl peroxypivalate is preferred as the radical polymerization initiator. It is also preferred to initiate the polymerization reaction after causing the monomer component, which is composed principally of the styrene monomer and contains the polymerization initiator dissolved therein, to fully penetrate into the pores of the PAS particles in advance.

The penetration of the monomer component can be accelerated in the following manner. In order to have the monomer component penetrate into the pores of the PAS particles prior to the initiation of the polymerization, the PAS particles are fully deaerated and maintained under reduced pressure When the PAS particles are dispersed in a dispersant, the PAS particles are depressurized close to the vapor pressure of the dispersant. The monomer component is thereafter brought into contact with the PAS particles in the depressurized state. Further penetration of the monomer component into the pores can be enhanced provided that the system is pressurized with an inert gas after the penetration of the monomer component into the pores of the PAS particles.

Although the polymerization is feasible without any dispersant, the polymerization may be practised in a dispersant. In general, the PAS particles with the monomer component and radical polymerization initiator adsorbed on or penetrated in the PAS particles are dispersed in water, followed by polymerization. By this suspension polymerization process, the polymerization reaction can be controlled with ease. In addition, the monomer component and its polymerization product can be dispersed evenly within the PAS particles, whereby the post-polymerization handling of the resultant polymer alloy can be simplified. A suspending agent such as polyethylene oxide, methyl-cellulose or a partially-saponified polyvinyl alcohol may also be added in a small amount in order to stabilize the dispersion of the reaction mixture.

Resin Composition

The resin composition (polymer alloy) useful in the practice of this invention has more uniform dispersibility compared with that obtained by melt-blending the styrene polymer with PAS, since the radically-polymerized polymer is dispersed finely within the PAS particles. According to an observation by the present inventors, the monomer component is adsorbed on and/or absorbed in the pores of the PAS particles and as a result, the apparent density becomes greater although the particles of the resultant product have substantially the same size as the original particles. When the styrene-based resin is extracted from the product, the percent remainder of the styrene-based resin is higher compared with a physical blend of polymers. It is thus estimated that chemical bonding such as graft polymerization or strong adsorption exists.

The resin composition is in the form of relatively uniform particles and since the radical polymerization of the monomer component have been carried out primarily within the pores of the particles, retains good powder characteristics of non-sticking and non-agglomerating properties which are inherent to the PAS particles. Moreover, owing to its homogeneity, no complex mixing operation is required for its mixing. Relatively mild conditions can be employed for its mechanical kneading operation, thereby making it possible to avoid deterioration at the time of processing.

Incidentally, one or more of various fillers, reinforcing materials, stabilizers, pigments and the like may also be added to such extents that the objects of the present invention are not impaired.

Biaxial Stretching Method

The resin composition (polymer alloy) obtained by subjecting the monomer component, which is composed principally of the styrene monomer, to radical polymerization in the presence of the PAS particles is then subjected to biaxial stretching and heat setting in accordance with a usual melt film-forming method. Namely, the resin composition is extruded in a molten state into a sheet or press-formed, followed by quenching into an amorphous film. Thereafter, it is biaxially stretched by a suitable method such as drawing and/or rolling. The biaxial stretching method may be either simultaneous biaxial stretching method or sequential biaxial stretching method. The stretching temperature may range from 80° C to 120° C. The draw ratio may be at least 4 times, preferably, at least 6 times in terms of area draw ratio. In addition, the heat setting temperature may preferably be in a range of 200–280° C.

The thickness of the biaxially-stretched film may suitably be from about 1 $\mu$m to about 150 $\mu$m. Although the thickness varies depending on the application field, it may preferably be 1–20 $\mu$m as a capacitor film and 15–125 $\mu$m as a flexible printed circuit board.

In general, the biaxial stretching of PAS is effected at a temperature somewhat higher than the glass transition point (Tg). It is necessary to control the temperature conditions strictly to an extremely narrow range in order to obtain a good uniform film. Especially, the stable production of thin films is difficult without such a strict temperature control. The formation of a polymer alloy from a PAS and a styrene-based resin can however improve the film-forming properties of the former resin, so that the temperature range of longitudinal stretching, which requires a strict control in sequential biaxial stretching, can be broadened over that required usually. In addition, the above formation facilitates the release of a film from rolls. Such features have extremely important significance for stably obtaining a film whose properties are uniform along the length thereof. In the case of stretching of a conventional PAS which is free of any polystyrene-based resin, the release of the film from the stretching rolls is unstable especially where the thickness of the film is small (this problem is called "stick-slip phenomenon" by those skilled in the art). In some instances, this unstableness may be solved by controlling the stretching temperature, draw ratio, atmosphere temperature and the like with extreme accuracy. It may however not be solved in some other instances no matter how strict the control is. Such unstableness leads to lack of uniformity in the state of orientation of the film after its stretching. In addition, the film may be torn or whitened in the subsequent steps, namely, the transverse stretching step and heat setting step. In practice, this means that the running properties are impaired. However, the above-mentioned stick-slip phenomenon is actually reduced significantly when a polymer alloy is formed together with the styrene-based resin. As a result, the film-forming properties are improved.

The resin composition of this invention permits more stable extrusion in both melt extrusion and film-forming properties compared with a mechanical blend of the PAS and styrene-based resin. Moreover, it tends to undergo less breakage upon its heat treatment. It is hence appreciated that the resin composition of this invention has been improved further.

Biaxially-Stretched Film

The biaxially-stretched film according to the present invention retains the good heat resistance and dimensional stability of the poly(arylene sulfide) and at the same time, has preferable surface roughness and high lubricity. These preferable features have been brought about for the following reasons. Namely, both resins are not dissolved completely in each other but the styrene-based resin is dispersed in the poly(arylene sulfide). Good dispersion of the styrene-based resin is also appreciated from the fact that preferable surface roughness has been obtained in spite of rather small proportions of the styrene-based resin. When compared with a biaxially-stretched film obtained from the mechanical blend of the PAS and styrene-based resin, it is observed that the dispersion of the styrene-based resin in the film is finer and more uniform. According to an observation by a scanning electron microscope, it is appreciated that the styrene-based resin in the film of this invention is as small as 2 $\mu$m and less in diameter, namely, is in the form of disks having a diameter of from about 0.5 $\mu$m to about 1.5 $\mu$m and a thickness of from about 0.05 $\mu$m to about 0.18 $\mu$m and is dispersed extremely fine and uniform. It is therefore understood that the surface smoothness of the film is excellent.

Regarding the surface roughness Ra ($\mu$m), the film of this invention generally has a value of from 0.005 $\mu$m to 0.01 $\mu$m. Compared with about 0.02 $\mu$m for films obtained from a melt blend, the surface roughness of the film of this invention is very small. Incidentally, the surface roughness as used herein means the average roughness along its center line, Ra and is a value measured by "SURFCOM A-550", which has been manufactured by Tokyo Seimitsu Co., Ltd., in accordance with the measurement method prescribed in JIS B-0601.

As to the three-dimensional roughness of biaxially-stretched films according to this invention, the surfaces of the films were observed by means of an instrument constructed of the aforementioned surface roughness meter and a three-dimensional roughness measuring plotter. It is appreciated that they showed planarity of excellent surface conditions (see FIG. 1 to FIG. 3). In contrast, a biaxially-stretched film obtained by melt-blending a styrene-based resin indicated insufficient planarity (see FIG. 4). Three-dimensional roughness will be described in detail in Examples.

On the other hand, their coefficients of dynamic friction are substantially the same so that the films of this invention had excellent lubricity together with good planarity.

As is apparent from the high dielectric strength (dielectric breakdown strength) of the biaxially-stretched films of the present invention, the dielectric strength characteristics of a poly(arylene sulfide) film have been retained at high levels simply but have been improved further.

As has been described above, biaxially-stretched films according to the present invention have been imparted with high lubricity without lowering the dielectric strength characteristics of poly(arylene sulfide) films. They are hence useful for a wide variety of applications, for example, led by capacitor films and including flexible printed circuit boards, films for magnetic tapes, electrical insulating materials for motors and transformers, ribbons for thermal transfer printers, etc.

ADVANTAGES OF THE INVENTION

Biaxially-stretched films according to this invention have extremely small surface roughness and are excellent in planarity, and moreover have small coefficients of dynamic friction and high lubricity. They have further superb advantages in that they are free of fish eyes, excellent in dielectric strength characteristics and good in film-forming properties. They are hence useful for various applications, especially, as capacitor films.

EMBODIMENTS OF THE INVENTION

The present invention will hereinafter be described specifically by the following Examples, Synthesis Experiments and Comparative Examples. Needless to say, the present invention is not limited only thereto. All designations of proportions ("part" and "part") will be by weight unless otherwise specifically indicated.

Synthesis Experiment 1 (Preparation of Composition)

A 20-l autoclave was charged with 11 kg of deionized water and 3,150 g of poly(p-phenylene sulfide) ("KPS", trade name; product of Kureha Chemical Industry Co., Ltd.; average particle size 330 $\mu$m; specific surface area: 12 m$^2$; melt viscosity at 310° C. and 200 sec$^{-1}$: 6,800 poises; bulk density: 46.0 g/dl). After thoroughly purging the autoclave with nitrogen, the autoclave was depressurized, followed by gradual addition of a mixture of 365 g of styrene, 0.35 g of benzoyl peroxide and 1.05 g of t-butyl peroxypivalate under stirring After continuously stirring the reaction mixture for 1 hour at room temperature, 1.0 kg of deionized water containing 1 g of polyethylene oxide dissolved therein was added further. The reaction mixture was heated to 60° C., at which polymerization was conducted for 4 hours. Further polymerization was carried out at 80° C. for 3 hours. After stirring the reaction mixture at 100° C. for 2 hours, it was cooled. The contents were filtered through a 150-mesh sieve, and the polymerization product thus obtained was washed with water and then dried. Its yield was 3,504 g. The bulk density of the resultant product (polymer alloy particles) was 53.2 g/dl.

A portion of the polymer alloy particles were placed in an autoclave and then extracted with toluene at 180° C for 3 hours. The proportion of polystyrene which was extracted was 70% of the whole polystyrene, so that 30 wt.% of polystyrene remained in the particles.

Synthesis Experiment 2 (Preparation of Composition)

A polymer alloy was obtained in exactly the same manner as in Synthesis Experiment 1 except that 18.25 g of acrylamide was charged further as a monomer in addition to styrene. The yield was 3,486 g. The bulk density of the resultant polymer alloy was 53.4 g/dl.

Synthesis Experiment 3 (Preparation of Composition)

A polymer alloy was obtained in exactly the same manner as in Synthesis Experiment 1 except that poly(p-phenylene sulfide) particles were washed in advance with an aqueous HCl solution (1%) and then neutralized with caustic soda (10% aqueous solution). The yield was 3,454 g. The bulk density of the resultant polymer alloy was 53.3 g/dl.

Polymerization conditions and the like, which were employed in Synthesis Experiments 1-3, are summarized in Table 1.

TABLE 1

|  | Synthesis Experiment | | |
|---|---|---|---|
|  | 1 | 2 | 3 |
| PPS | 3,150 | 3,150 | 3,150 |
| Styrene | 365 | 365 | 365 |
| Acrylamide | — | 18.25 | — |
| BPO | 0.35 | 0.35 | 0.35 |
| t-BPV | 1.05 | 1.05 | 1.05 |
| Water | 11,000 | 11,000 | 11,000 |
| Yield | 3,504 | 3,486 | 3,454 |
| Melt viscosity | 5,400 | 5,600 | 5,400 |
| Bulk density (g/dl) | 53.2 | 53.4 | 53.3 |

Note:
(1) All the values in the Table are in grams.
(2) BPO: benzoyl peroxide
(3) t-BPV: t-butyl peroxypivalate.
(4) The PPS in Synthesis Experiment 3 had been subjected to an HCl treatment.
(5) The melt viscosities are values as measured at 310° C. and a shear rate of 200 sec$^{-1}$

EXAMPLE 1

The polymer alloy particles obtained in Synthesis Experiment 1 were kneaded and pelletized by an extruder. The resulting pellets were extruded into a film.

After preheating the film with metal rolls whose surface temperature was controlled at about 60° C., the film was subjected to inter-roll stretching at a draw ratio of 3.3 times on ceramic rolls controlled at 97° C. The film was then introduced into a tenter, in which it was stretched by 3.3 times in the transverse direction by means of a tenter stretching machine in a hot air atmosphere controlled at 96° C. After the transverse stretching, the sheet was immediately fed via a buffer zone to a heat setting zone in which it was thermally set at a hot air temperature of 265° C. At that time, the percent relaxation in the transverse direction was 5%. The film thickness was 8 μm.

For the sake of comparison, using 100 parts of poly(p-phenylene sulfide) employed in Synthesis Experiment 1, a film free of any additive (Comparative Example 1), another film added with 0.3 part of fine powder (average particle size: 0.7 μm) of calcium carbonate as an inorganic filler (Comparative Example 2) and a further film melt-blended with 10 parts of a polystyrene-based resin ("TOPOLEX", trade mark; product of Mitsui-Toatsu Chemicals Inc.) (Comparative Example 3) were separately formed in the same manner as in Example 1.

Their surface roughness, coefficients of dynamic friction, dielectric strength and running properties upon film formation were then measured. Results are summarized in Table 2.

Incidentally, the surface roughness Ra (μm) of each film was measured by "SURFCOM A-550", which had been manufactured by Tokyo Seimitsu Co., Ltd., in accordance with the measurement method prescribed in B-0601. The dielectric strength (V/μm) of each film was measured in accordance with JIS C-2318 and C-2110, namely, by applying a d.c. voltage to the film at room temperature and an electrode diameter of 25 mm in air. As its dielectric strength datum, the average of 40 values measured was used. The coefficient of dynamic friction of each film was measured by a friction meter "Model TR", which had been manufactured by Toyo Seiki Seisakusho, Ltd., in accordance with ASTM D-1894.

A film having high dielectric strength permits application of a high voltage, but a film having low dielectric strength is broken at a low voltage. Accordingly, the dielectric strength of a film can serve as an important index or standard for the evaluation of physical properties of the film as a capacitor film. Since a thinner can be used as its dielectric strength increases, a film having high dielectric strength can be fabricated into a capacitor element having a large capacitance in spite of its small size.

TABLE 2

|  | Comp. Ex. 1 No additive | Comp. Ex. 2 Added with calcium carbonate | Comp. Ex. 3 Added with styrene-based resin | Example 1 Intra-particle* polymerization of styrene |
|---|---|---|---|---|
| Film thickness (μm) | 8 | 8 | 8 | 8 |
| Surface roughness Ra (μm) | 0.004 | 0.010 | 0.023 | 0.007 |
| Coefficient of dynamic friction | >1 | 0.45 | 0.40 | 0.50 |
| Dielectric strength (V/μm) | 290 | 200 | 360 | 360 |
| Running properties of film upon its formation | A little poor | A little poor | Extremely good | Extremely good |

*"Intra-particle polymerization of styrene" indicates a resin composition obtained by subjecting styrene to radical polymerization in the presence of poly(p-phenylene sulfide) particles.

The "running properties of film upon its formation" in the bottom row of Table 2 indicates the tendency of tearing of each film inside the tenter (stretching and heat setting zones) in the course of its production. "A little poor" indicates that tearing took place once or twice per hour upon continuous formation of the film, while "extremely good" indicates that absolutely no tearing occurred.

The films added with the styrene-based resin (Example 1 and Comparative Example 3) had better dielectric strength even compared to the film free of any additive and their surfaces were somewhat roughened to have sufficient lubricity. Compared to the film of Comparative Example 3 in which the polystyrene-based resin was melt-blended, the film of Example 1 had an extremely small surface roughness of 0.007 but its coefficient of dynamic friction was at substantially the same level. It is hence appreciated that the film of Example 1 was equipped with excellent surface planarity and lubricity.

When employed as a capacitor film by way of example, the films of Comparative Examples 1 and 2 were practically unusable or inferior in physical properties but the invention film of Example 1 was extremely suitable.

In order to confirm the excellent planarity of the film of this invention, the state of dispersion of polystyrene in the film obtained in each of Example 1 and Comparative Example 3 was observed by a scanning electron microscope (magnification: 2,000×). In the film of Example 1, polystyrene was dispersed as fine disk-like particles of about 0.08 μm in thickness and about 1.5 μm in diameter in parallel to the plane of the film. Its surface conditions presented extremely good planarity. In addition, no formation of fish eyes was observed. In contrast, in the film of Comparative Example 3 which was obtained by melt-blending the polystyrene-based resin, the polystyrene-based resin was in the form of disk-like particles which were distributed in parallel to the plane of the film and as large as about 3 μm to 10 μm in diameter. Its surface roughness was rather great. The film of Comparative Example 3 was thus found to be insufficient in planarity.

EXAMPLE 2

Using the polymer alloy of Synthesis Experiment 2, a biaxially-stretched film was obtained in the same manner as in Example 1. The surface roughness of the film was 0.006 μm, while its coefficient of dynamic friction was 0.48. The static charge of the film was measured upon completion of its slitting and winding. It was 10 KV. This value was small in view of the fact that the static charge of a film formed solely of poly(p-phenylene sulfide) is usually 20 KV.

EXAMPLE 3

Using the polymer alloy of Synthesis Experiment 3, a biaxially-stretched film was obtained in the same manner as in Example 1. The surface roughness of the film was 0.006 μm, while its coefficient of dynamic friction was 0.50. When the film was slit and then taken up, it looked rather colorless and transparent compared with conventional poly(p-phenylene sulfide) films upon their slitting and winding. The conventional films presented a relatively brownish color at that stage.

EXAMPLE 4

Table 3 shows the surface roughness and coefficients of dynamic friction of biaxially-stretched films prepared respectively from polymer alloys which had in turn been obtained by changing the proportion of styrene monomer relative to poly(p-phenylene sulfide) in Synthesis Experiment 1.

TABLE 3

| Styrene (%) | Surface roughness (μm) | Coefficient of dynamic friction |
|---|---|---|
| 5 | 0.005 | 0.60 |
| 15 | 0.007 | 0.50 |
| 20 | 0.008 | 0.47 |

Measurement of Three-Dimensional Roughness

In order to conduct a more detailed comparison in surface smoothness between biaxially-stretched films according to this invention and a biaxially-stretched film obtained from a melt blend of a styrene-based resin, their surfaces were measured by a surface roughness tracer equipped with a plotter for the measurement of three-dimensional roughness ("SURFCOM A-550"; manufactured by Tokyo Seimitsu Co., Ltd.). Measurement results are diagrammatically illustrated in FIG. 1 through FIG. 4.

Figure 2:
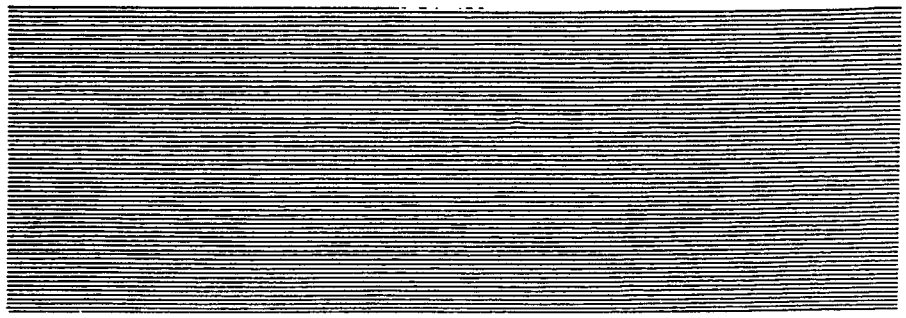
Figure 3:
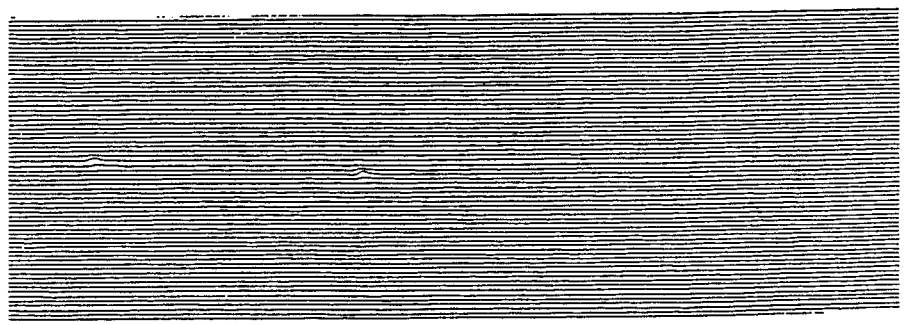
Figure 4:
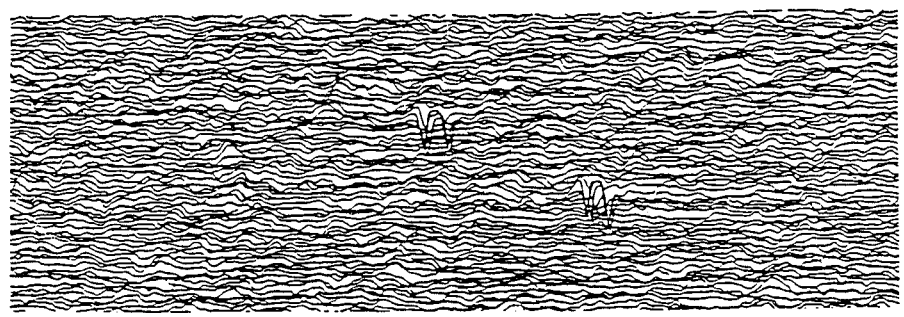

FIG. 1 illustrates the surface conditions of the film obtained in Example 1. FIG. 2 shows the surface conditions of the 15%-styrene film in Table 3, while FIG. 3 indicates the surface conditions of the 20%-styrene film which is also given in Table 3. FIG. 4 depicts the surface conditions of the film of Comparative Example 3, which was blended with the styrene-based resin.

In each of the drawings, the horizontal direction corresponds to MD (the machine direction, namely, the direction of longitudinal stretching) of the film, while the vertical direction indicates TD (the transverse direction, namely, the direction of transverse stretching). The magnification of the drawing is 200× in MD and 200× in TD. The direction perpendicular to the plane of the film is shown at a magnification of 10,000× and indicates the direction of height and depth of ruggedness in the surfaces of the film. Those three-dimensional roughness diagrams were obtained by scanning their corresponding films in the machine direction (MD) by means of the above-described measuring instrument.

As is apparent from FIG. 1 through FIG. 4, the invention films of the Examples had extremely good surface planarity, while the film shown in FIG. 4 and obtained from the melt blend presented substantial surface ruggedness and had insufficient planarity.

What is claimed is:

1. A high-lubricity film obtained by biaxially stretching a resin composition which has been obtained by radical polymerization of 3–25 parts by weight of a monomer component composed of at least 70 weight percent styrene monomer in the presence of 100 parts by weight of particles of a straight-chain poly(arylene sulfide) having a melt viscosity of at least 1,000 poises.

2. The high-lubricity film as claimed in claim 1, wherein the particles have an average particle size of at least 100 μm.

3. The high-lubricity film as claimed in claim 1, wherein the particles have a porous structure having a specific surface area of at least 3 m²/g.

4. The high-lubricity film as claimed in claim 1, wherein the resin composition has been obtained by radical polymerization of the monomer component, with most of the monomer component being absorbed within pores of the particles and polymerized therein.

5. The high-lubricity film as claimed in claim 1, wherein the monomer component is composed of styrene and not greater than 30 weight percent of at least one comonomer comprising acrylamide, methacrylamide, glycidyl methacrylate, monomethyl itaconate or monoethyl itaconate.

6. The high-lubricity film as claimed in claim 1, wherein the surface roughness Ra of the film is at most 0.01 μm on average.

7. The high-lubricity film as claimed in claim 1, wherein the straight chain poly(arylene sulfide) is obtained from a bifunctional monomer component.

8. The high-lubricity film as claimed in claim 7 wherein the straight-chain poly(arylene sulfide) comprises poly(p-phenylene sulfide) or a copolymer containing p-phenylene sulfide units and m-phenylene sulfide units.

* * * * *